(12) United States Patent
DeGarrido (10) Patent No.: US 9,503,054 B2
(45) Date of Patent: Nov. 22, 2016

(54) LINEAR PHASE FIR BIORTHOGONAL WAVELET FILTERS WITH COMPLEMENTARITY FOR IMAGE NOISE REDUCTION

(71) Applicant: LSI Corporation, San Jose, CA (US)

(72) Inventor: Diego Pinto DeGarrido, Philadelphia, PA (US)

(73) Assignee: Avago Technolgies General IP (Singapore) Pte. Ltd., Singapore (SG)

(*) Notice: Subject to any disclaimer, the term of this patent is extended or adjusted under 35 U.S.C. 154(b) by 351 days.

(21) Appl. No.: 13/855,474

(22) Filed: Apr. 2, 2013

(65) Prior Publication Data

US 2014/0280417 A1    Sep. 18, 2014

Related U.S. Application Data

(60) Provisional application No. 61/783,410, filed on Mar. 14, 2013.

(51) Int. Cl.
*H03H 17/02* (2006.01)
*G06T 5/00* (2006.01)
*G06T 5/10* (2006.01)

(52) U.S. Cl.
CPC .......... *H03H 17/0248* (2013.01); *G06T 5/002* (2013.01); *G06T 5/10* (2013.01); *H03H 17/0269* (2013.01); *G06T 2207/10016* (2013.01); *G06T 2207/20064* (2013.01); *H03H 2222/06* (2013.01)

(58) Field of Classification Search
None
See application file for complete search history.

(56) References Cited

U.S. PATENT DOCUMENTS

| | | | |
|---|---|---|---|
| 4,815,023 A | 3/1989 | Arbeiter | |
| 5,097,331 A * | 3/1992 | Chen | G06F 17/145 375/240.11 |
| 5,943,642 A | 8/1999 | Choi | |
| 2003/0081705 A1* | 5/2003 | Miller | 375/346 |
| 2003/0123584 A1* | 7/2003 | Siegel et al. | 375/350 |

* cited by examiner

*Primary Examiner* — Michael D Yaary (57) ABSTRACT

In described embodiments, Linear Phase, Finite Impulse Response, filters incorporate a power complementarity property into a perfect reconstruction filter bank. Non-linear constraints for type A and type B filters are included in the Sequential Quadratic Programming design of the filters. An initial Quadrature Mirror Filter includes perfect reconstruction constraints, which might be optimized through iterative design techniques. Embodiments might be employed in noise reduction applications related to, for example, signal processing of images.

20 Claims, 7 Drawing Sheets

FIG. 7
CAMERAMAN

LINEAR PHASE FIR BIORTHOGONAL WAVELET FILTERS WITH COMPLEMENTARITY FOR IMAGE NOISE REDUCTION

RELATED APPLICATIONS

This application claims the benefit of the filing date of U.S. provisional application No. 61/783,410, filed on Mar. 14, 2013, the teachings of which are incorporated herein by reference.

BACKGROUND

Often, in digital signal processing, signals are decomposed into low and high frequency bands that are digitally processed, and the processed bands combined to reconstruct the original signal. Such an example is found in sub-band coding. In sub-band coding, a wideband signal in the frequency domain is subjected to a spectrum analysis procedure to apportion its energy content among a plurality of sub-bands, which are, in-turn, individually encoded. Coding generally involves decimation and quantization with differing quantizing thresholds. Coding might also include statistical coding. After processing and/or transmission, the decimated sub-band information of the coded sub-bands is expanded through interpolation and combined to synthesize a replica of the original wideband signal.

An example of sub-band coding includes perfect reconstruction implemented as a two-channel filter bank, also known as the Quadrature Mirror Filter (QMF) Bank since it uses power complementary filters. Perfect reconstruction is a process by which a signal is completely recovered after being separated into its low frequencies and high frequencies. Perfect reconstruction is a process that generally requires four filters, two low-pass filters and two high-pass filters, as well as a down-sampler and a up-sampler between the two low-pass and between the two high-pass filters. Output filters generally have a gain of two to compensate for the preceding up-sampler.

Two-channel Linear Phase FIR biorthogonal wavelet filter banks can be designed using Sequential Quadratic Programming (SQP). This technique for perfect reconstruction biorthogonal filter bank design simultaneously minimizes the low-pass and high-pass filters quadratic error function given a set of non-linear perfect reconstruction constraints. The solutions obtained by this technique and other iterative design algorithms result in general asymmetrical filters with poor power complementarity characteristics.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, the present invention filters a signal with a bi-orthogonal wavelet filter bank. A signal is decomposed, with a decomposition bank, into high-pass and low pass signal components using corresponding high-pass and low-pass filter decomposition kernels; a filtering processor applies noise filtering to the high-pass and low-pass signal components. A synthesis bank reconstructs a processed signal from the noise-filtered high-pass and low-pass signal components using corresponding high-pass and low-pass filter synthesis kernels, wherein the filter parameters defining the high-pass and low-pass filter decomposition kernels and the high-pass and low-pass filter synthesis kernels are generated with power complimentarity and perfect reconstruction restraints.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

In accordance with described embodiments, Linear Phase (LP) Finite Impulse Response (FIR) filters incorporate a power complementarity property into a perfect reconstruction filter bank. Non-linear constraints for type B filters are included in the Sequential Quadratic Programming (SQP) design of the filters. An initial Quadrature Mirror Filter (QMF) includes perfect reconstruction constraints, which might be optimized through iterative design techniques. Embodiments of the present invention might be employed in noise reduction applications related to, for example, signal processing of images. Power complimentary filter banks in accordance with the described embodiments exhibit relatively higher subjective quality and signal to noise (SNR). The techniques of the SQP design methods described herein might be extended to incorporate coding gain-optimized filter banks.

The exemplary embodiments herein are described with respect to a two-channel, Linear Phase FIR bi-orthogonal wavelet filter bank system having parameters derived through the aforementioned SQP design process known in the art of filter design. The perfect reconstruction bi-orthogonal filter bank SQP design process simultaneously minimizes the low-pass and high-pass filters quadratic error function given a set of non-linear perfect reconstruction constraints. In accordance with exemplary embodiments, a non-trivial transition band quadratic form forces power complementarity on the desired filters generated by the SQP design process. Both odd length filters (type 1 low-pass/type 1 high-pass) designs and even length filters (type 2 low-pass/type 4 high-pass) design are provided for herein.

Figure 1:
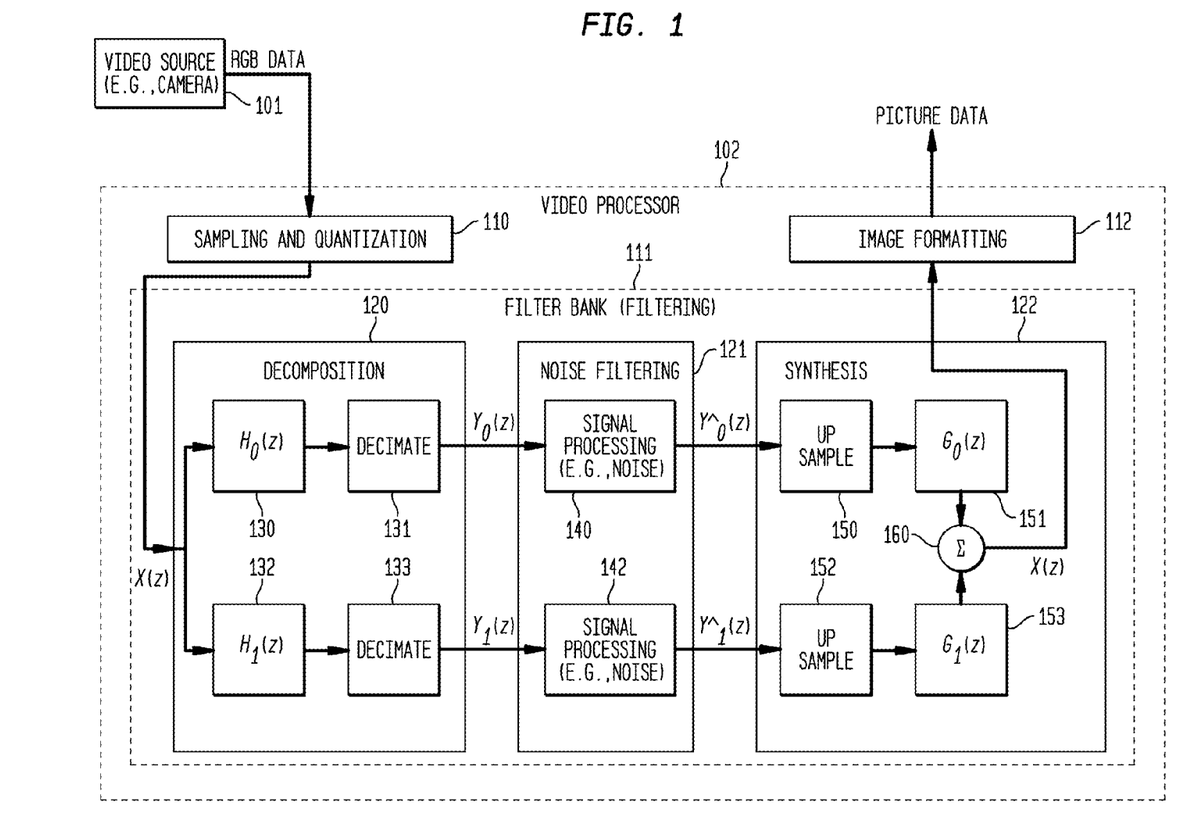
FIG. 1 shows a block diagram of a 2-band filter bank in accordance with an exemplary embodiment.

FIG. 1 shows a block diagram of a 2-band filter bank in accordance with an exemplary embodiment. As shown, filter bank 111 applies filtering in accordance with exemplary embodiments. For the exemplary description herein, filtering bank 111 is included in video processor 102, along with sampling and quantization module 110 and image formatting module 112. Video processor 102 receives video red-green-blue (RGB) data from video source 101, which might be a video camera, which is typically sampled and quantized by module 110 to provide digitized video RGB data X(z) for processing. Data X(z) is an input signal that is regularly sampled in a single dimension and linearly mapped into quantized time. Processed image information from filter bank 111, in turn, is typically formatted by module 112, providing picture (either an image or video frame data). Such processing by sampling and quantization module 110 and image formatting module 112 is well known in the art, and detailed description of the operations by these modules is omitted. While the present embodiments are described herein for video processing, the present invention is not so limited and might be applied to any system where sub-band encoding, processing, and synthesis might be employed.

Filtering bank 111 is shown as a two-channel, Linear Phase FIR bi-orthogonal wavelet filter bank. Filtering bank 111 includes a decomposition module 120, noise filtering processor 121, and synthesis module 122. Decomposition module low-pass filters and high-pass filters data X(z) in convolvers 130 and 132 by convolving data X(z) with kernels $H_0(z)$ and $H_1(z)$ respectively. If $H_1(z)$ is equivalent to $H_0(-z)$, then convolvers 130 and 132 are complementary, linear-phase filter functions with a cross-over at half the X(z) sampling rate, where each exhibits −6 dB attenuation, providing a QMF bank. Subsequently, the convolved outputs are down-sampled (decimated for the embodiment herein, by 2) by decimators 131 and 133 to provide low frequency filtered sub-bands $Y_0(z)$ and high frequency filtered sub-bands $Y_1(z)$, respectively.

The kernals $H_0(z)$ and $H_1(z)$ each has N number of taps and exhibits a corresponding symmetry. For N an odd number of taps, the kernels $H_0(z)$ and $H_1(z)$ each exhibit even, or cosine symmetry, while for N an even number of taps, the kernels $H_0(z)$ and $H_1(z)$ each exhibit odd, or sine symmetry. For even symmetry, decimation by decimators 131 and 133 is in-phase decimation, while for odd symmetry, decimation by decimators 131 and 133 is anti-phase decimation.

Low frequency filtered sub-bands $Y_0(z)$ and high frequency filtered sub-bands $Y_1(z)$ are then subject to noise filtering, which might be applied by signal processing modules 140 and 141, respectively. While noise filtering is shown, other types of processing, such as encoding for transmission and decoding at reception, might be applied. The algorithms performed by signal processing modules 140 and 141 typically depend on the application, and numerous types of noise filtering, such as Wiener filtering, might be applied for noise reduction in an image. Signal processing modules 140 and 141 might be separately implemented, or represent sub-modules of a single signal processor. Signal processing modules 140 and 141 provide output noise-filtered sub-bands $\hat{Y}_0(z)$ and noise-filtered sub-bands $\hat{Y}_1(z)$. Assuming decimated $X(z)*H_0(z)$ and decimated $X(z)*H_1(z)$ are perfectly recovered (i.e., noise-filtered sub-bands $\hat{Y}_0(z)$ and noise-filtered sub-bands $\hat{Y}_1(z)$ are perfectly recovered), synthesis module 122 applies up-sampling through zero insertions in up-samplers 150 and 152 to generate samples at the original sampling rate of X(z). Up-sampling is carried out by interleaving null samples with the decimated samples. For even symmetry, up-sampling by up-samplers 150 and 152 is by in-phase insertion, while for odd symmetry, up-sampling by up-samplers 150 and 152 is by anti-phase insertion.

The up-sampled noise-filtered sub-bands $\hat{Y}_0(z)$ and $\hat{Y}_1(z)$ each contains a set of frequency components below half Nyquist rate and a set of frequency components above half Nyquist rate. In each signal, half of the components represent valid signals, while the others represent aliasing from the decimate/up-sample process. Consequently, the up-sampled, noise-filtered sub-bands $\hat{Y}_0(z)$ and $\hat{Y}_1(z)$ are filtered in convolvers 151 and 153 having kernels $G_0(z)$ and $G_1(z)$ respectively. If $G_1(z)$ is equivalent to $G_0(-z)$, then convolvers 151 and 153 are complementary, linear-phase filter functions with a cross-over at half the X(z) sampling rate, providing a QMF bank. Typically, for aliasing-free reconstruction, $G_0(z)$ and $G_1(z)$ are selected to be equivalent to $2H_1(-z)$ and $-2H_0(-z)$, respectively, in such case.

The low frequency and high frequency components are then added back together in summer 160 to generate the reconstructed signal $\hat{X}(z)$. The degree to which is equivalent to original signal X(z) depends on many computational factors (e.g., resolution of arithmetic operations), as well as the tuning of the low-pass and high-pass filtering operations. Consequently, the design process for selecting the filter parameters for the discrete time kernels $H_0(z)$, $H_1(z)$, $G_0(z)$ and $G_1(z)$ will now be described.

Defining filter length of $H_0(z)$ and $H_1(z)$ as $L_0$, and $L_1$, respectively, with $L_0 \leq L_1$, the prefect reconstruction (PR) filter transfer function T(z) for linear phase FIR is a pure delay dependent on filter lengths $K_d = (L_0 + L_1)/2 - 1$ multiplied by constant K, yielding the relation (1):

$$T(z) = H_0(z)H_1(-z) - H_1(z)H_0(-z) = Kz^{-(L_0 + L_1)/2 - 1} \quad (1)$$

By expressing filters in terms of poly-phase components and substituting into the PR requirement of relation (1) using time domain representation, the constraint relations for the filters might be as in relation (2):

$$\sum_{n=0}^{2k-1} (-1)^n h_0[2k-1-n] h_1[n] = \frac{1}{2}\delta\left[k - \frac{L_0 + L_1}{4}\right], \quad (2)$$

for $k = 1, 2, \ldots, (L_0 + L_1)/4$, where $\delta[k = (L_0 + L_1)/4] = 1$, otherwise 0. The $h_0(k)$ and $h_1(k)$ are the time domain coefficients for the kernels $H_0(z)$ and $H_1(z)$. The number of independent constraint equations for PR is $K_c = (L_0 + L_1)/4$ and the sum of the lengths must be a multiple of 4.

Two classes of PR linear phase FIR filter banks can be defined. In type A class, the analysis filters have even length and opposite symmetry, while in type B class, the analysis filters have odd length and are symmetric. Again, both class A and class B filters can be defined having low-pass frequency response $H_0(w)$ and high-pass frequency response $H_1(w)$. For type A class, an exemplary type 2 symmetric linear FIR filter with $L_0$ even and real low-pass frequency response is given by relation (3):

$$H_0(w) = y_0^T s_0(w); \qquad (3)$$

$$y_0 = [\, a_0[1] \quad a_0[2] \quad \ldots \quad a_0[M_0]\,]^T;$$

$$s_0(w) = \left[\cos\left(\frac{w}{2}\right) \quad \cos\left(\frac{3w}{2}\right) \quad \ldots \quad \cos\left(\left(M_0 - \frac{1}{2}\right)w\right)\right]^T;$$

with $M_0 = L_0/2$ and coefficients $h_0[n] = 0.5$; $a_0[M_0-n+1]$ and $h_0[M_0+n]$ equal $0.5\, a_0[n]$; and $n=1, 2, \ldots, M_0$. The high-pass type 4 anti-symmetric linear FIR filter with $L_1$ even and real high-pass frequency response is given by relation (4):

$$H_1(w) = y_1^T s_1(w); \qquad (4)$$

$$y_1 = [\, a_1[1] \quad a_1[2] \quad \ldots \quad a_1[M_1]\,]^T;$$

$$s_1(w) = \left[\sin\left(\frac{w}{2}\right) \quad \sin\left(\frac{3w}{2}\right) \quad \ldots \quad \sin\left(\left(M_1 - \frac{1}{2}\right)w\right)\right]^T.$$

with $M_1 = L_1/2$ and coefficients $h_1[n] = -0.5$; $a_1[M_1-n+1]$ and $h_1[M_1+n]$ equal $0.5\, a_0[n]$; and $n=1, 2, \ldots, M_1$.

For type B class, the low-pass symmetric linear FIR type 1 filter has $y_0$ and $s_0(w)$ as given by relation (5):

$$y_0 = [b_0[0]\ b_0[1]\ b_0[2] \ldots b_0[M_0]]^T;\ s_0(w) = [1\ \cos(w) \ \cos(2w) \ldots \cos(M_0 w)]^T; \qquad (5)$$

with $M_0 = L_0 - 1/2$ and coefficients $h_0[n] = 0.5\, b_0[M_0-n+1]$; $h_0[M_0+1] = b_0[0]$; and $h_0[M_0+n+1] = 0.5\, b_0[n]$; and $n=1, 2, \ldots, M_0$. The high-pass type 1 symmetric linear FIR filter has $y_1$ and $s_1(w)$ as given by relation (6):

$$y_1 = [b_1[0]\ b_1[1]\ b_1[2] \ldots b_1[M_1]]^T;\ s_1(w) = [1\ \cos(w) \ \cos(2w) \ldots \cos(M_1 w)]^T; \qquad (6)$$

with $M_1 = L_1 - 1/2$ and coefficients $h_1[n] = 0.5\, b_1[M_1-n+1]$; $h_1[M_1+1] = b_1[0]$; and $h_1[M_1+n+1] = 0.5\, b_1[n]$; and $n=1, 2, \ldots, M_1$. AC/DC polyphase normalization of a given design might be required for such class type A and B filters. For type B filters, the filter design herein adds AC/DC polyphase normalization constraints for the sum of the corresponding phases, as given in relation (7):

$$\sum_{n=0}^{L0-1} h_0[2n] = \sum_{n=0}^{L0-1} h_0[2n+1] \text{ and} \qquad (7)$$

$$\sum_{n=0}^{L1-1} h_1[2n] = -\sum_{n=0}^{L1-1} h_1[2n+1].$$

Given the PR constraints for filter design, the Analytical Quadrature Mirror Filter (QMF) as known by one skilled in the art can be defined for low-pass filter $D_0(w)$ and high-pass filter $D_1(w)$ as given in relations (8) and (9), respectively, where $(f_0(w))^{1/2}$ defines the transition band:

$$D_0(w) = \begin{cases} 1, & \text{if } |w| \le w_{p0} \\ \sqrt{f_0(w)} & \text{if } w_{p0} < |w| \le w_{s0}, \\ 0 & \text{if } w_{s0} < |w| \le \pi \end{cases} \qquad (8)$$

with $\sqrt{f_0(w)} = (1 - W_0)\sqrt{(2W_0 + 1)}$ with $W_0 = \dfrac{w - w_{p0}}{w_{s0} - w_{p0}}$ is a function compared to the iteratively designed QMF low-pass filter, and $$D_1(w) = \begin{cases} 0, & \text{if } |w| \le w_{s1} \\ \sqrt{f_1(w)} & \text{if } w_{s1} < |w| \le w_{p1}, \\ 1 & \text{if } w_{p1} < |w| \le \pi \end{cases} \qquad (9)$$

where $\sqrt{f_1(w)} = (1 - W_1)\sqrt{2(W_1 + 1)}$ with $W_1 = \dfrac{w_{p1} - w}{w_{p1} - w_{s1}}$ is the analogous function in the high pass filter. In the case of half-band filters, $w_{p0} + w_{s0} = \pi$, $w_{p1} + w_{s1} = \pi$, $w_{p0} = w_{s1}$, and $w_{p1} = w_{s0}$.

From these previous relations above, the coefficients for type A filters are as given in relations (10) and (11):

$$a_0[n] = \frac{1}{\pi}\int_0^\pi D_0(w)\cos\{(n - 0.5)w\}dw, \qquad (10)$$

where $n=1, 2, \ldots, M_0$ with $h_0[n]=[a_0[M_0:-1:1], a_0[1:1:M_0]]$, and $$a_1[n] = \frac{1}{\pi}\int_0^\pi D_1(w)\sin\{(n - 0.5)w\}dw, \qquad (11)$$

where $n=1, 2, \ldots, M_1$ with $h_1[n]=[-a_1[M_1:-1:1], a_1[1:1:M_1]]$.

From these previous relations above, the coefficients for type B filters are as given in relations (12) and (13):

$$b_0[n] = \frac{1}{\pi}\int_0^\pi D_0(w)\cos(nw)dw, \qquad (12)$$

where $n=1, 2, \ldots, M_0$ with $h_0[n]=[b_0[M_0:-1:1], b_0[0], b_0[1:1:M_0]]$, and $$b_1[n] = \frac{1}{\pi}\int_0^\pi D_1(w)\cos(nw)dw, \qquad (13)$$

where $n=1, 2, \ldots, M_1$ with $h_1[n]=[b_1[M_1:-1:1], b_1[0], b_1[1:1:M_1]]$. The colon operator in the above relations (first:step:last) generates a sequence of numbers employed to create or index into the arrays. The functions weighted by $(f_{0,1}(w))^{1/2}$ might be calculated through numerical integration.

As employed with the exemplary embodiments, the non-linear sequential quadratic programming (SQP) method is initialized using relations (10) and (11) or relations (12) and (13) above. In accordance with the exemplary embodiments, the SQP method employs an objective function $\Phi(h_0, h_1)$ to be minimized as given in relation (14):

$$\Phi(h_0, h_1) = \qquad (14)$$

$$\frac{1}{2\pi}\Bigg\{\alpha_0 \int_0^{w_{p0}} [1 - H_0(w)]^2 dw + \gamma_0 \int_{w_{p0}}^{w_{s0}} \left|\sqrt{f_0(w)} - H_0(w)\right|^2 dw +$$

-continued $$\beta_0 \int_{w_{s0}}^{\pi} [H_0(w)]^2 dw + \alpha_1 \int_0^{w_{s1}} |H_1(w)|^2 dw +$$

$$\gamma_1 \int_{w_{s1}}^{w_{p1}} \left[ \sqrt{f_1(w)} - H_1(w) \right]^2 dw + \beta_1 \int_{w_{p1}}^{\pi} [1 - H_1(w)]^2 dw \bigg\};$$

where low-pass weights $[\alpha_0, \gamma_0, \beta_0]$ and high-pass weights $[\alpha_1, \gamma_1, \beta_1]$ are associated with the low-pass and high-pass analysis filters, respectively, and are all $\geq 0$.

A vector $1=[1\ 1\ \ldots\ 1]^1$ can be defined representing the zero-frequency response, Nyquist frequency response, and transition band frequency response, since $H_0(0)=1$, $H_0(w_1)=(f_0(w))^{1/2}1^T s_0(w)$ and $H_1(w_1)=(f_1(w))^{1/2}1^T s_1(w)$. Using this vector 1, relation (14) might be written as in relation (15):

$$\Phi = \frac{1}{2} y_0^T Q_0 y_0 + P_0^T y_0 + d_0 + \frac{1}{2} y_1^T Q_1 y_1 + P_1^T y_1 + d_1 \quad (15)$$

where the low-pass($i=0$)/high-pass($i=1$) quadratic term $Q_i$ is:

$$Q_i = \frac{1}{\pi} \left[ \alpha_i \underbrace{\int_0^{w_{p0}, w_{s1}} s_i(w) s_i^T(w) dw}_{Q_{pi}} + \right.$$

$$\left. \underbrace{\gamma_i \int_{w_{p0}, w_{s1}}^{w_{s0}, w_{p1}} s_i(w) s_i^T(w) dw}_{Q_{ti}} + \underbrace{\beta_i \int_{w_{s0}, w_{p1}}^{\pi} s_i(w) s_i^T(w) dw}_{Q_{si}} \right],$$

where the low-pass($i=0$)/high-pass($i=1$) linear term $p_i$ is:

$$p_i = -\frac{1}{\pi} \left[ \phi_i \underbrace{\int_{0, w_{p1}}^{w_{p0}, \pi} s_i^T(w) dw}_{p_{pi}} + \gamma_i 1^T \underbrace{\int_{w_{p0}, w_{s1}}^{w_{s0}, w_{p1}} \sqrt{f_i(w)} s_i(w) s_i^T(w) dw}_{p_{ti}} \right],$$

where $\phi_0 = \alpha_0$ and $\phi_1 = \beta_1$; and where the low-pass($i=0$)/high-pass($i=1$) constant term $d_i$ is:

$$d_i = \frac{1}{2\pi} \left[ \phi_i \left( 1^T \int_{0, w_{pi}}^{w_{p0}, \pi} dw 1 \right) + \gamma_i \left( 1^T \int_{w_{p0}, w_{s1}}^{w_{s0}, w_{p1}} f_i(w) s_i(w) s_i^T(w) dw 1 \right) \right].$$

The matrices $Q_{p0}$, $Q_{r0}$, $Q_{s0}$, $Q_{s1}$, $Q_{t1}$ and $Q_{p1}$, and the vectors $p_{p0}$ and $p_{p1}$ have closed form expressions. Given the QMF design and the solution defined by minimization of the objective function described above, perfect reconstruction constraints from relation (2) above are imposed on the solution. Perfect reconstruction constraints are given by relation (16):

$\hat{C}_0 h_1 = \hat{m}$ where $\hat{C}_0$ is given by:

$$\hat{C}_0 = \begin{bmatrix} h_0[1] & -h_0[0] & 0 & 0 & 0 & \ldots & 0 \\ h_0[3] & -h_0[2] & h_0[1] & -h_0[0] & 0 & \ldots & 0 \\ \vdots & \vdots & \vdots & \vdots & \vdots & \ldots & 0 \\ h_0[L_0-2] & -h_0[L_0-3] & \ldots & h_0[1] & -h_0[0] & \ldots & 0 \\ 0 & -h_0[L_0-1] & h_0[L_0-2] & -h_0[L_0-3] & \ldots & \ldots & 0 \\ \vdots & \vdots & \vdots & \vdots & \vdots & \ldots & 0 \\ 0 & 0 & 0 & 0 & 0 & -h_0[L_0-1] & h_0[L_0-2] \end{bmatrix}, \quad (16)$$

and $h_1 = [h_1[0] h_1[1] \ldots h_1[L_1-1]]^T$ and $\hat{m}$ is a $(K_d+1)$-dimensional column vector given by $=[0 \ldots \frac{1}{2} \ldots 0]^T$, and the $\hat{C}_0$ matrix is a $(K_d+1)*L_1$ matrix. Describing the perfect reconstruction constraints in a non-linear manner is shown in relation (17):

$$\begin{cases} u_k(y_0, y_1) = y_0^T D_k y_1 = 0, & k = 1, 2, \ldots, K_c - 1 \\ u_k(y_0, y_1) = y_0^T D_k y_1 - \frac{1}{2} = 0, & k = K_c \end{cases}.$$

where $D_k$'s can be derived from the $\hat{C}_0$ matrix. Defining the $\hat{C}_0$ matrix that gives position and sign information of the filter coefficients $h_0$, the matrix is constructed as given above in relation (16). A sequence of matrices is calculated where each element is calculated by relation (18):

$$\hat{D}_k(\text{abs}(\hat{C}_0(1:K_c, 1:L_1)) \neq 0.1:L_1) = \text{sign}(\hat{C}_0(1:K_c, 1:L_1)), \quad (18)$$

with $\hat{D}_k$'s originally initialized as the null matrix, and each is then folded column-wise and row-wise with appropriate weighting to account for symmetry, anti-symmetry and alignment of the filter coefficients.

For relation (18), considering type A class filters, the folding operation encompasses the relation (19):

$$\tilde{D}_k(1:l_0, M_1:-1:1) = \quad (19)$$

$$\frac{1}{2} \left[ -\hat{D}_k(1:L_0, 1:M_1) + \hat{D}_k(1:L_0, L_1 + 1 - (1:M_1)) \right]$$

and $$D_k(M_0:-1:1, 1:M_1) =$$

$$\frac{1}{2} \left[ \tilde{D}_k(1:M_0, 1:M_1) + \tilde{D}_k(L_0 + 1 - (1:M_0), 1:M_1) \right].$$

For relation (18), considering type B class filters, the folding operation encompasses the relation (20):

$$\tilde{D}_k(1:L_0, M_1 + 1:-1:1) = \quad (20)$$

$$\frac{1}{2} \left[ \hat{D}_k(1:L_0, 1:M_1 + 1) + \hat{D}_k(1:L_0, L_1 - (0:M_1)) \right]$$

and $$D_k(M_0 + 1:-1:1, 1:M_1 + 1) =$$

$$\frac{1}{2} \left[ \tilde{D}_k(1:M_0 + 1, 1:M_1 + 1) + \tilde{D}_k(L_0 - (0:M_0), 1:M_1 + 1) \right].$$

However, for type B class filters, additional polyphase constraints might be added, given in relation (21):

$$D_{K_c+1}=[(-1)^{(0:M_0)}]^T[(-1)^{(0:M_1)}] \text{ and } D_{K_c+2}=\text{ones }(M_0+1, M_1+1); \quad (21)$$

where ones($M_0+1$, $M_1+1$) is a non-square matrix filled with one's and size ($M_0+1$)*($M_1+1$), and provides additional relations (17') to (17) for type B class filters:

$$\begin{cases} u_{K_c+1}(y_0, y_1) = y_0^T D_{K_c+1} y_1 = 0, \\ u_{K_c+2}(y_0, y_1) = y_0^T D_{K_c+2} y_1 = 0 \end{cases} \quad (17')$$

Given the QMF design, the solution defined by minimization of the objective function described above, and the perfect reconstruction constraints imposed, the solution might be obtained through sequential quadratic programming techniques. The non-linear minimization problem can be formulated as in relation (22):

$$\min \Phi(y) \text{ subject to } u(y)=0.$$

with $y=[y_0^T:y_1^T]^T$ and $$u(y)=[u_1(y)u_2(y) \ldots u_{K_c}(y)]^T \text{ for type A class: } u(y)=[u_1(y)u_2(y) \ldots u_{K_c+2}(y)]^T \text{ for type B class.} \quad (22)$$

Such minimization can be solved using a Lagrange-Newton method, such as defining the Lagrangian function as in relation (23):

$$L(y,\lambda)=\Phi(y)-\lambda^T u(y)$$

with $$\lambda=[\lambda_1 \lambda_2 \ldots \lambda_{K_c}]^T \text{ for type A class; } \lambda=[\lambda_1 \lambda_2 \ldots \lambda_{K_c+2}]^T \text{ for type B class:} \quad (23)$$

where $\lambda$'s are Lagrange multipliers.

Given relation (23), a local solution for relation (23) can be generated by expanding the partial derivative of the Lagrange function around y (i) and l (i) in a Taylor series and neglecting higher order terms, yielding an iterative set of equations defined by relation (24):

$$[\nabla^2 L(y^{(i)}, \lambda^{(i)})][\delta y^T, \delta \lambda^T]^T = -\nabla L(y^{(i)}, \lambda^{(i)}), \quad (24)$$

where $\nabla^2$ represents the second partial derivative operator. Relation (24) might be solved through iterative adjustment of $\delta y$ and $\delta \lambda$, where $$\lambda^{(i+1)}=\lambda^{(i)}+\delta\lambda; \; y^{(i+1)}=y^{(i)}+\delta y.$$

The vectors $\delta y$ and $\lambda^{i+1}$ can be found by solving the linear equations system in relation (25):

$$\begin{bmatrix} G^{(i)} & -A^{(i)} \\ -A^{(i)T} & 0 \end{bmatrix} \begin{bmatrix} \delta y \\ \lambda^{(i+1)} \end{bmatrix} = \begin{bmatrix} -g^{(i)} \\ u^{(i)} \end{bmatrix}, \quad (25)$$

where the analytical form for G is as in relation (26) (with S=0 for type A class and S=2 for type B class) and the linear term g is as in relation (27):

$$G = \begin{bmatrix} Q_0 & \sum_{k=1}^{K_e+S} \lambda_k D_k \\ -\sum_{k=1}^{K_e+S} \lambda_k D_k^T & Q_1 \end{bmatrix} \quad (26)$$

$$g = \begin{bmatrix} Q_0 y_0 + p_0 \\ Q_1 y_1 + p_1 \end{bmatrix}. \quad (27)$$

The constraint term A is given in relation (28):

$$A = \begin{bmatrix} D_1(1r)y_1 & D_2(1r)y_1 & \ldots & D_k(1r)y_1 \\ D_1(2r)y_1 & D_2(2r)y_1 & \ldots & D_k(2r)y_1 \\ \vdots & \vdots & \ldots & \vdots \\ D_1(Rr)y_1 & D_2(Rr)y_1 & \ldots & D_k(Rr)y_1 \\ y_0^T D_1(1c) & y_0^T D_2(1c) & \ldots & y_0^T D_k(1c) \\ y_0^T D_1(2c) & y_0^T D_2(2c) & \ldots & y_0^T D_k(2c) \\ \vdots & \vdots & \ldots & \vdots \\ y_0^T D_1(Cc) & y_0^T D_2(Cc) & \ldots & y_0^T D_k(Cc) \end{bmatrix} \quad (28)$$

where $R=M_0$ and $C=M_1$ for type A class and for type B class $R=M_0+3$ and $C=M_1+3$.

Several methods for solution of relation (41) might be employed, but in accordance with embodiments herein a preferred method might employ an orthogonal factorization method. Defining the relation (29):

$$\begin{bmatrix} G^{(i)} & -A^{(i)} \\ -A^{(i)T} & 0 \end{bmatrix}^{-1} = \begin{bmatrix} H^{(i)} & -T^{(i)} \\ -T^{(i)T} & U^{(i)} \end{bmatrix}, \quad (29)$$

where:

$$H=G^{-1}-G^{-1}A(A^T G^{-1}A)^{-1}A^T G^{-1}; \quad T=G^{-1}A(A^T G^{-1}A)^{-1}; \quad U=-(A^T G^{-1}A)^{-1}.$$

From relation (41) and the relation (29), the iterative solution is given by relation (30):

$$\delta y = -Hg - Tu; \; \lambda = T^T g + Uu. \quad (30)$$

An alternative representation of the inverse Lagrangian matrix is given in relation (31):

$$H=Z(Z^T GZ)^{-1}Z^T; \; T=Y-HGY; \; U=-Y^T GT. \quad (31)$$

where matrices Y and Z are defined in relation (32) (matrices Y and Z might be determined through QR factorization of A (i.e., [QR]=qr(A)):

$$R.=R(1:K_c+S.1:K_c+S); \; Q.=Q(1:R+C.1:K_c+S); \; Z=Q(1:R+C.K_c+S+1:R+C); \; Y=Q.R.^{-T}. \quad (32)$$

Figure 2:
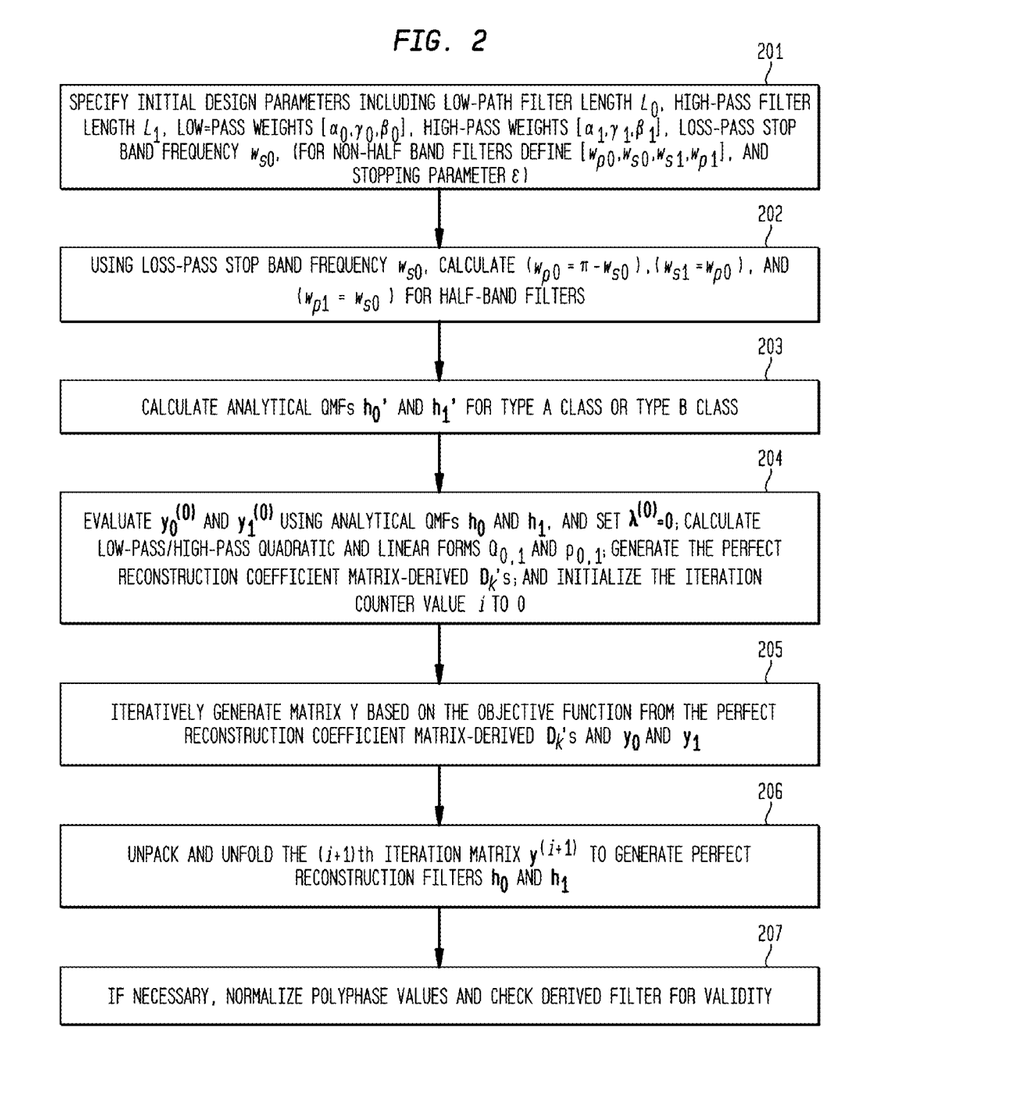
FIG. 2 shows a flow diagram for design of a short power complementarity filter for the filter bank in accordance with the exemplary embodiment of FIG. 1.

FIG. 2 shows a flow diagram for design of a filter in accordance with the exemplary embodiment. At step 201, initial design parameters are specified including low-path filter length $L_0$, high-pass filter length $L_1$, low-pass weights [$\alpha_0$, $\gamma_0$, $\beta_0$], high-pass weights [$\alpha_1$, $\gamma_1$, $\beta_1$], and loss-pass stop band frequency $w_{s0}$, (for non-half band filters define [$w_{p0}$, $w_{s0}$, $w_{s1}$, $w_{p1}$], and stopping parameter $\epsilon$). At step 202, using loss-pass stop band frequency $w_{s0}$, calculate ($w_{p0}=\pi-w_{s0}$), ($w_{s1}=w_{p0}$), and ($w_{p1}=w_{s0}$) for half-band filters.

At step 203, analytical QMFs $h_0'$ and $h_1'$ are calculated using relations (10) and (11) above for type A class or relations (12) and (13) for type B class. For type A class for some embodiments, when $L_0=L_1$, low-pass QMF filter is evaluated with two taps less than the high-pass filter. At step 204, using analytical QMFs $h_0$ and $h_1$, evaluate $y_0^{(0)}$ and $y_1^{(0)}$, and set $\lambda^{(0)}=0$. Calculate low-pass/high-pass quadratic and linear forms $Q_{0,1}$ and $p_{0,1}$ using relation (15). Generate the perfect reconstruction coefficient matrix-derived $D_k$'s in relation (17), and initialize the iteration counter value i to 0.

At step 205, an iterative process generates matrix y based on the objective function described above from the perfect reconstruction coefficient matrix-derived $D_k$'s and $y_0$ and $y_1$. The iterative process of step 205 is described subsequently with respect to FIG. 3.

At step 206, the (i+1)th iteration matrix $y^{(i+1)}$ is unpacked and unfolded to generate perfect reconstruction filters $h_0$ and $h_1$. At step 207, if necessary, polyphase values are normalized according to relation (33) below and checked for validity using relation (2).

$$\hat{h}_0[2n] = \frac{Gh_0[2n]}{|\sum h_0[2n]|} \text{ and } \hat{h}_0[2n+1] = \frac{Gh_0[2n+1]}{|\sum h_0[2n+1]|};$$
$$\hat{h}_1[2n] = \frac{Gh_1[2n]}{|\sum h_1[2n]|} \text{ and } \hat{h}_1[2n+1] = \frac{Gh_2[2n+1]}{|\sum h_1[2n+1]|}. \quad (33)$$

where the operator |.| denotes that absolute value, with the sum performed over the polyphase taps and G is the gain associated with the polyphases (in general, G=½).

Figure 3:
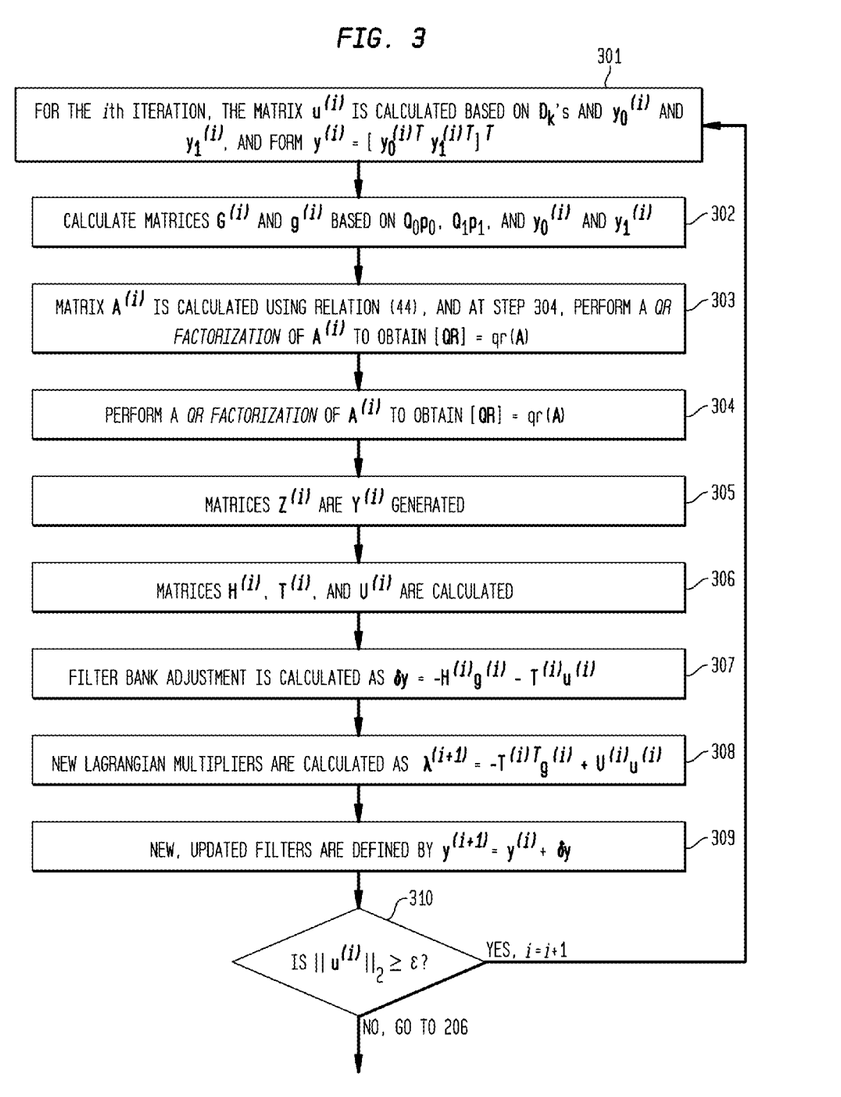
FIG. 3 shows a flow diagram for iterative design of filter parameters of FIG. 2.

FIG. 3 shows a flow diagram for design filter parameters of the iterative step 205 of FIG. 2. At step 301, for the ith iteration, the matrix $u^{(i)}$ is calculated based on $D_k$'s and $y_0^{(i)}$ and $y_1^{(i)}$, and form $y^{(i)}=[y_0^{(i)T} y_1^{(i)T}]^T$. At step 302, matrices $G^{(i)}$ and $g^{(i)}$ are calculated based on $Q_0 p_0$, $Q_1 p_1$, and $y_0^{(i)}$ and $y_1^{(i)}$ using relations (26) and (27). At step 303, the matrix $A^{(i)}$ is calculated using relation (28), and at step 304, perform a QR factorization of $A^{(i)}$ to obtain [QR]=qr(A).

At step 305, the matrix $Z^{(i)}$ is generated with the relation (32) and the matrix $Y^{(i)}$ is generated using the relation (32). At step 306, the matrices $H^{(i)}$, $T^{(i)}$, and $U^{(i)}$ are calculated using the relation (31). At step 307, the filter bank adjustment is calculated as $\delta y = -H^{(i)} g^{(i)} - T^{(i)} u^{(i)}$. At step 308, new Lagrangian multipliers are calculated as $\lambda^{(i+1)} = -T^{(i)T} g^{(i)} + U^{(i)} u^{(i)}$.

At step 309, the new, updated filters are defined by $y^{(i+1)} = y^{(i)} + \delta y$. At step 310, a test determines whether another iteration is required. The test of step 310 calculates whether $\|u^{(i)}\|_2 \geq \epsilon$, and, if so, the iteration count is incremented as i=(i+1), and the process returns to step 301. Otherwise, the process advances to step 206 of FIG. 2.

Performance of the exemplary embodiments employing filter coefficients can be compared using an image noise reduction application. The framework for the image noise reduction application considers Wiener filtering on the wavelet coefficients to de-noise an image subject to Additive Gaussian White Noise (AWGN). Simulation compares an exemplary embodiments of short filters with 8/8, 9/7 and 7/5 taps with a popular, prior art Cohen, Daubechies and Feauveau 9/7 (CDF) filter bank for image noise reduction. Exemplary filters in general outperform these prior art filter banks in terms of signal-to-noise ratio (SNR) (e.g., the 9/7 CDF filters when the noise standard deviation is =20 for several noisy images). Using our filters the wavelet transform yields de-noised images with better edge preservation and perceptually smooth flat regions even when noise standard deviation is less than 20.

Figure 4:
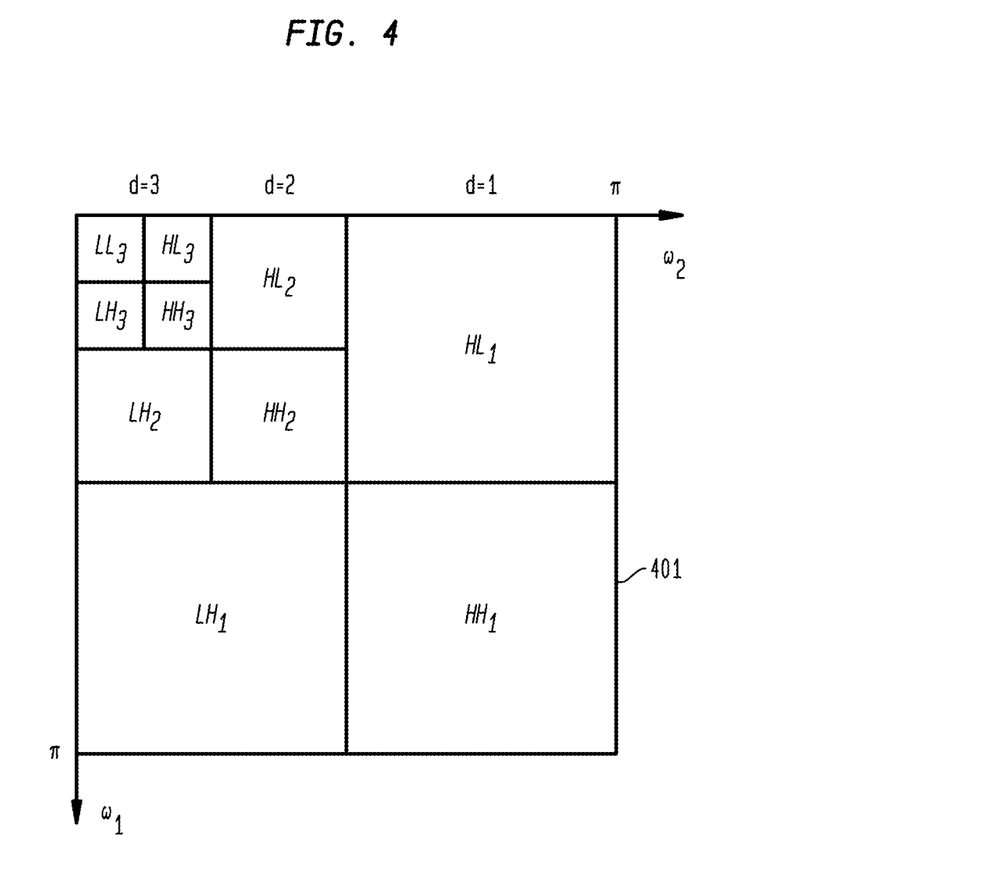
FIG. 4 shows a wavelet transform as might be applied to an image and processed with the 2-band filter bank of FIG. 1.

FIG. 4 shows a wavelet transform as might be applied to an image and processed with the 2-band filter bank of FIG. 1. FIG. 4 shows a image pyramid with three scales (dimension (d)=1, 2, 3) as employed to compare performance of the exemplary embodiments of short filters with 8/8, 9/7 and 7/5 taps with the popular, prior art Cohen, Daubechies and Feauveau 9/7 (CDF) filter bank for image noise reduction.

The filter bank 9/7 CDF is based on polynomial factorization and has 4/4 (low-pass and high-pass) zeros at z=(1, −1). The short filters with 8/8, 9/7 and 7/5 taps are less constrained with 2/2 zeros at z=(1, −1) for the odd number of taps and 1/1 zero for the even number of taps.

Referring to FIG. 4, an original block 401 generated from segmentation of an original image can be transformed into data having a total of four (4) sub-bands in a frequency domain through the level-1 discrete wavelet transform. The data transformed by the level-1 discrete wavelet transform can be divided into four (4) sub-bands, i.e., $LL_1$, $LH_1$, $HL_1$, and $HH_1$. The $LL_1$ sub-band includes data of low frequency in vertical and horizontal directions, which are acquired by applying, to the original image, a low pass filter in horizontal and vertical directions. The $LH_1$ sub-band includes data of low frequency in a vertical direction and data of high frequency in a horizontal direction, which are acquired by applying a low pass filter in a vertical direction and a high pass filter in a horizontal direction. The $HL_1$ sub-band includes data of high frequency in a vertical direction and data of low frequency in a horizontal direction, which are acquired by applying a high pass filter in a vertical direction and a low pass filter in a horizontal direction. The HH sub-band, includes data of high frequency in vertical and horizontal directions, which are acquired by applying a high pass filter in horizontal and vertical directions.

For the comparison, only the low vertical and horizontal frequency filtered sub-bands are further decomposed. In the second dimension, the $LL_1$ sub-band is further filtered with a level-2 wavelet transform in a similar manner to that described for the level-1 discrete wavelet transform, producing sub-bands $LL_2$, $LH_2$, $HL_2$, and $HH_2$. In the third dimension, a level-3 wavelet transform is applied to the $LL_2$ sub-band, further decomposing the image into sub-bands $LL_3$, $LH_3$, $HL_3$, and $HH_3$.

Figure 5A:
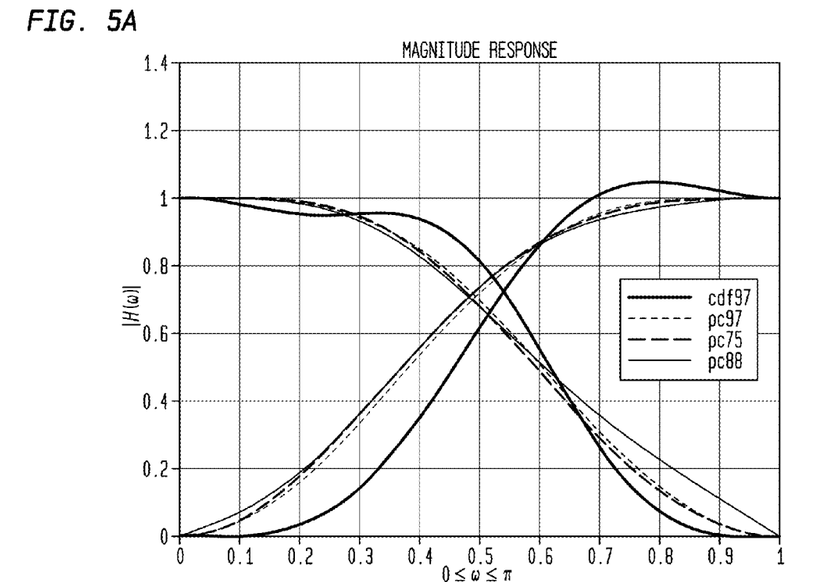
FIGS. 5A and 5B show the filter magnitude response and power complementarity magnitude response, respectively of a 9/7 CDF filter bank in comparison to the exemplary embodiments of short power complementarity filters with 8/8, 9/7 and 7/5 taps.
Figure 5B:
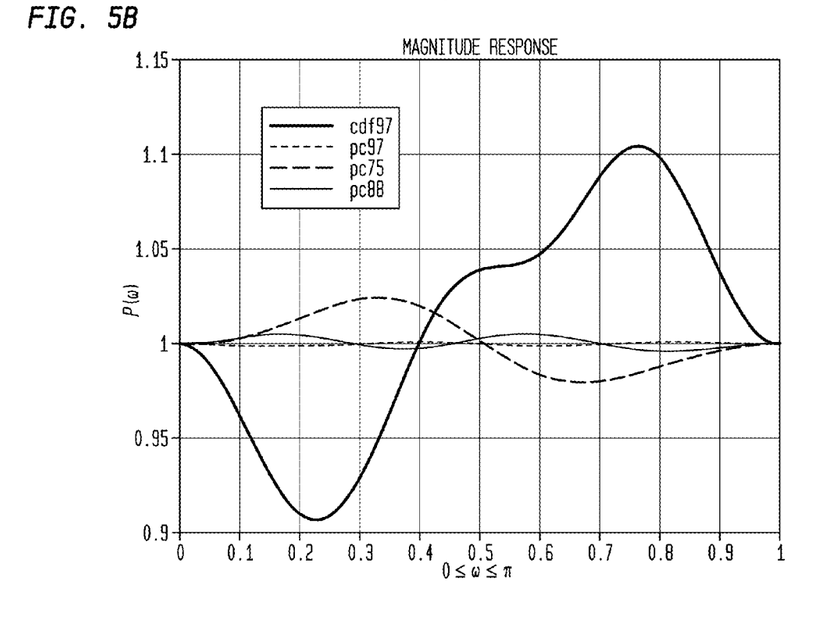

FIGS. 5A and 5B show the filter magnitude response and power complementarity (PC) magnitude response, respectively of a 9/7 CDF filter bank in comparison to the exemplary embodiments of short PC filters with 8/8, 9/7 and 7/5 taps. Table 1 lists the bi-orthogonal filter bank parameters for the short PC filters with 8/8, 9/7 and 7/5 taps; Table 2 lists the filter coefficients for the short PC filters with 8/8 taps; Table 3 lists the filter coefficients for the short PC filters with 9/7 taps; and Table 4 lists the filter coefficients for the short PC filters with 7/5 taps.

TABLE 1

($\epsilon$ = 1e−9)

| $(L_0, L_1)$ | $[\alpha_0, \gamma_0, \beta_0]$ | $[\alpha_1, \gamma_1, \beta_1]$ | $w_{s0}$ |
|---|---|---|---|
| 8/8 PC | [17, 2e−2, 0.01] | [0.038, 4e−2, 0.07] | 0.8π |
| 9/7 PC | [4, 1e−5, 0.3] | [0.7, 1.2e−2, 0.3] | 0.8π |
| 7/5 PC | [25.9, 1e−1, 1e−1] | [1.0e−1, 0.98e−1, 11] | 0.7425π |

TABLE 2

(8/8 PC, $h_0(7 − n) = h_0(n)$, $h_1(7 − n) = −h_1(n)$)

| (n) | $h_0(n)$ | $h_1(n)$ |
|---|---|---|
| 0 | −0.005186622972251 | 0.008525082253391 |
| 1 | −0.021361794327302 | 0.035111681472622 |
| 2 | 0.030966959018683 | 0.025122734872490 |
| 3 | 0.495581458280870 | −0.501463864346741 |

TABLE 3

| (9/7 PC, $h_0(8-n) = h_0(n)$, $h_1(6-n) = -h_1(n)$) | | |
|---|---|---|
| (n) | $h_0(n)$ | $h_1(n)$ |
| 0 | 0.000648948363173 | 0.004948291928071 |
| 1 | −0.007060998310698 | −0.053840772128817 |
| 2 | −0.049736440846335 | −0.254948291928071 |
| 3 | 0.257060998310698 | 0.607681544257634 |
| 4 | 0.598174984966325 | |

TABLE 4

| (7/5 PC, $h_0(6-n) = h_0(n)$, $h_1(4-n) = -h_1(n)$) | | |
|---|---|---|
| (n) | $h_0(n)$ | $h_1(n)$ |
| 0 | −0.010617032479904 | −0.058013562818697 |
| 1 | −0.045752372221495 | −0.250000000000000 |
| 2 | 0.260617032479904 | 0.616027125637393 |
| 3 | 0.591504744442990 | |

Figure 6A:
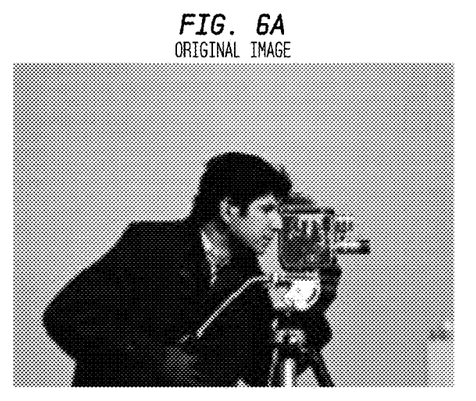
FIG. 6A shows an original image before additive noise.
Figure 6B:
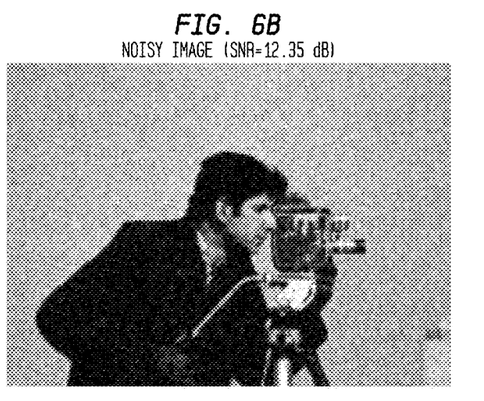
FIG. 6B shows the original image of FIG. 6A with additive noise.
Figure 6C:
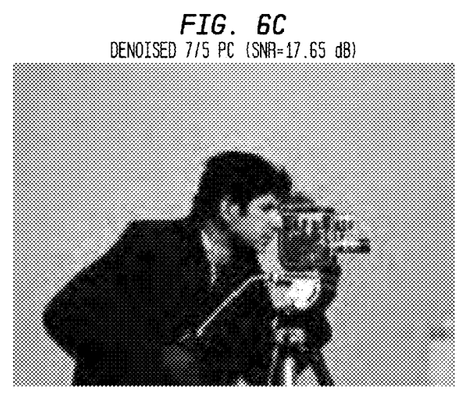
FIG. 6C shows the de-noised image of FIG. 6B processed with a short power complementarity filter 7/5 taps.
Figure 6D:
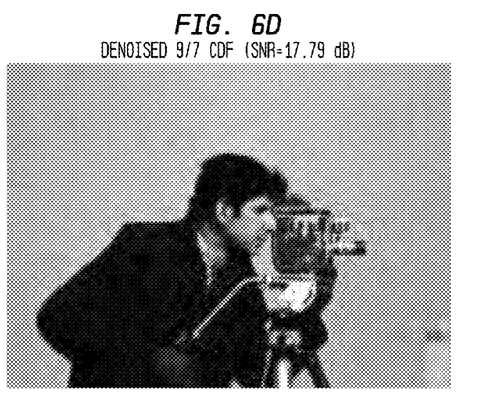
FIG. 6D shows the de-noised image of FIG. 6B processed with a 9/7 CDF filter bank.
Figure 7:
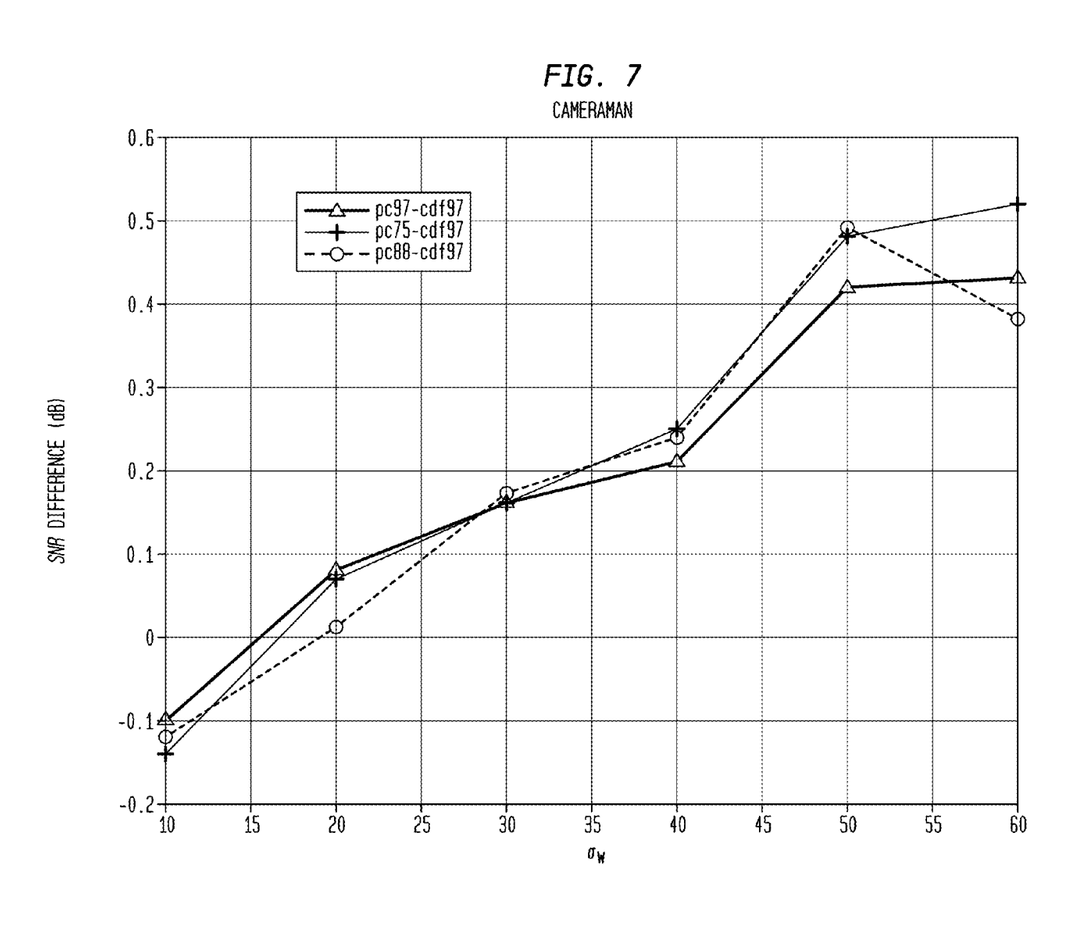
FIG. 7 shows a comparison of noise difference for the original and processed images of FIGS. 6A-6D of a 9/7 CDF filter bank in comparison to the exemplary embodiments of short filters with 8/8, 9/7 and 7/5 taps.

FIG. 6A shows an original image before additive noise, and FIG. 6B shows the original image of FIG. 6A with additive noise such that the SNR is 12.35 dB. FIG. 6C shows the de-noised image of FIG. 6B processed with a short power complementarity filter 7/5 taps, where the SNR is improved to 17.65 dB. Comparing FIG. 6C to the de-noised image of FIG. 6B processed with a 9/7 CDF filter bank as shown in FIG. 6D (with a SNR of 17.79 dB), the image of FIG. 6C shows improvement in "smoothing" out noise at the discontinuities between high and low frequencies (e.g., around the dark arm and light background) with a filter having fewer taps and complexity. FIG. 7 shows a comparison of noise difference for the original and processed images of FIGS. 6A-6D of a 9/7 CDF filter bank in comparison to the exemplary embodiments of short filters with 8/8, 9/7 and 7/5 taps.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Moreover, the terms "system," "component," "module," "interface,", "model" or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Although the subject matter described herein may be described in the context of illustrative implementations to process one or more computing application features/operations for a computing application having user-interactive components the subject matter is not limited to these particular embodiments. Rather, the techniques described herein can be applied to any suitable type of user-interactive component execution management methods, systems, platforms, and/or apparatus.

The present invention may be implemented as circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing blocks in a software program. Such software may be employed in, for example, a digital signal processor, micro-controller, or general-purpose computer.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits. The present invention can also be embodied in the form of a bitstream or other sequence of signal values electrically or optically transmitted through a medium, stored magnetic-field variations in a magnetic recording medium, etc., generated using a method and/or an apparatus of the present invention.

Unless explicitly stated otherwise, each numerical value and range should be interpreted as being approximate as if the word "about" or "approximately" preceded the value of the value or range.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Signals and corresponding nodes or ports may be referred to by the same name and are interchangeable for purposes here.

No claim element herein is to be construed under the provisions of 35 U.S.C. §112, sixth paragraph, unless the element is expressly recited using the phrase "means for" or "step for."

It is understood that various changes in the details, materials, and arrangements of the parts which have been described and illustrated in order to explain the nature of this invention may be made by those skilled in the art without departing from the scope of the embodiments of the invention as encompassed in the following claims.

I claim:

1. Apparatus for filtering a signal with a bi-orthogonal wavelet filter bank, the apparatus comprising:
   a decomposition bank configured to decompose a signal into high-pass and low-pass signal components using corresponding high-pass and low-pass filter decomposition kernels;
   a filtering processor configured to apply noise filtering to the high-pass and low-pass signal components, wherein noise filtering includes applying paired filters to a block generated by segmenting an image into vertically and horizontally symmetrical sub-bands in a subsequent dimension; and
   a synthesis bank configured to reconstruct a processed signal from the noise-filtered high-pass and low-pass signal components using corresponding high-pass and low-pass filter synthesis kernels,
   wherein the filter parameters defining the high-pass and low-pass filter decomposition kernels and the high-pass and low-pass filter synthesis kernels are generated with power complimentarity and perfect reconstruction restraints.

2. The apparatus of claim 1, wherein: the filter parameters are generated by
   i) specifying an initial set of filter parameters including half-band pass/stop frequencies,
   ii) generating analytical quadrature mirror (QMF) filters for the initial set of filter parameters,
   iii) applying a set of perfect reconstruction constraints to the analytical QMF filters, and
   solving an objective function for the analytical QMF filters with the set of perfect reconstruction constraints to generate the filter parameters.

3. The apparatus of claim 2, wherein the solution to the objective function for the analytical QMF filters is an iterative solution by a non-linear sequential quadratic programming (SQP) method.

4. The apparatus of claim 1, wherein: the decomposition bank down-samples the high-pass and low pass signal components, and the synthesis bank up-samples the noise-filtered high-pass and low-pass signal components.

5. The apparatus of claim 4, wherein the signal is a video signal and the filtering processor applies a Wiener filter to the high-pass and low-pass signal components.

6. The apparatus of claim 4, wherein the high-pass and low-pass filter decomposition kernels are $H_0(z)$ and $H_1(z)$, respectively, the high-pass and low-pass filter synthesis kernels are $G_0(z)$ and $G_1(z)$, respectively, and $G_0(z)$ and $G_1(z)$ are selected as equivalent to $2H_1(-z)$ and $-2H_0(-z)$ when down-sampling and up-sampling is by 2.

7. The apparatus of claim 1, wherein the filter parameters are defined for perfect reconstruction linear phase finite impulse response (FIR) filter banks.

8. The apparatus of claim 7, wherein the perfect reconstruction linear phase FIR filter banks are selected as at least one of a type A class and a type B class filter.

9. The apparatus of claim 1, wherein the filter parameters include normalized and validated polyphase values.

10. A method of filtering a signal with a bi-orthogonal wavelet filter bank, the method comprising:
    decomposing, with a decomposition bank, a signal into high-pass and low-pass signal components using corresponding high-pass and low-pass filter decomposition kernels;
    applying, with a filtering processor, noise filtering to the high-pass and low-pass signal components, wherein noise filtering includes applying paired filters to a block generated by segmenting an image into two-dimensionally symmetrical sub-bands in a subsequent dimension; and
    reconstructing, with a synthesis bank, a processed signal from the noise- filtered high-pass and low-pass signal components using corresponding high-pass and low-pass filter synthesis kernels,
    wherein the filter parameters defining the high-pass and low-pass filter decomposition kernels and the high-pass and low-pass filter synthesis kernels are generated by applying power complimentarity and perfect reconstruction restraints.

11. The method of claim 10, comprising generating the filter parameters by
    i) specifying an initial set of filter parameters including half-band pass/stop frequencies,
    ii) generating analytical quadrature mirror (QMF) filters for the initial set of filter parameters,
    iii) applying a set of perfect reconstruction constraints to the analytical QMF filters, and
    solving an objective function for the analytical QMF filters with the set of perfect reconstruction constraints to generate the filter parameters.

12. The method of claim 11, wherein solving the objective function for the analytical QMF filters is iteratively solving by a non-linear sequential quadratic programming (SQP) method.

13. The method of claim 10, wherein the decomposing includes down-sampling the high-pass and low pass signal components, and the reconstructing includes up-sampling the noise-filtered high-pass and low-pass signal components.

14. The method of claim 13, wherein the signal is a video signal and the applying the noise filtering applies a Wiener filter to the high-pass and low-pass signal components.

15. The method of claim 13, wherein the high-pass and low-pass filter decomposition kernels are $H_0(z)$ and $H_1(z)$, respectively, the high-pass and low-pass filter synthesis kernels are $G_0(z)$ and $G_1(z)$, respectively, and $G_0(z)$ and $G_1(z)$ are selected as equivalent to $2H_1(-z)$ and $-2H_0(-z)$ when down-sampling and up-sampling is by 2.

16. The method of claim 10, wherein the filter parameters are defined for perfect reconstruction linear phase finite impulse response (FIR) filter banks.

17. The method of claim 16, wherein the perfect reconstruction linear phase FIR filter banks are selected as at least one of a type A class and a type B class filter.

18. The method of claim 10, comprising normalizing and validating polyphase values for the filter parameters.

19. A non-transitory machine-readable storage medium, having encoded thereon program code, wherein, when the program code is executed by a machine, the machine implements a method for filtering a signal with a bi-orthogonal wavelet filter bank, comprising the steps of:

decomposing, with a decomposition bank, a signal into high-pass and low pass signal components using corresponding high-pass and low-pass filter decomposition kernels;

applying, with a filtering processor, noise filtering to the high-pass and low-pass signal components, wherein noise filtering includes applying paired filters to a block generated by symmetrically segmenting an image in sub-bands across a vertical direction and a horizontal direction, wherein segmenting is performed in a subsequent dimension; and reconstructing, with a synthesis bank, a processed signal from the noise-filtered high-pass and low-pass signal components using corresponding high-pass and low-pass filter synthesis kernels, wherein the filter parameters defining the high-pass and low-pass filter decomposition kernels and the high-pass and low-pass filter synthesis kernels are generated by applying power complimentarity and perfect reconstruction restraints.

20. The apparatus of claim 19, wherein: the filter parameters are generated by:

specifying an initial set of filter parameters including half-band pass/stop frequencies;

generating analytical quadrature mirror (QMF) filters for the initial set of filter parameters;

applying a set of perfect reconstruction constraints to the analytical QMF filters; and solving an objective function for the analytical QMF filters with the set of perfect reconstruction constraints to generate the filter parameters.

* * * * *